US011159155B1

(12) United States Patent
Shi et al.

(10) Patent No.: US 11,159,155 B1
(45) Date of Patent: Oct. 26, 2021

(54) LEAKAGE CONTROL OF MULTI-CHIP MODULE AND METHOD THEREOF

(71) Applicant: Realtek Singapore Private Limited, Singapore (SG)

(72) Inventors: Yunhua Shi, Singapore (SG); Jyun-Ren Chen, Singapore (SG)

(73) Assignee: REALTEK SINGAPORE PRIVATE LIMITED, Singapore (SG)

( * ) Notice: Subject to any disclaimer, the term of this patent is extended or adjusted under 35 U.S.C. 154(b) by 0 days.

(21) Appl. No.: 17/249,800

(22) Filed: Mar. 15, 2021

(30) Foreign Application Priority Data

Dec. 28, 2020 (TW) .................................. 109146553

(51) Int. Cl.
*H03K 17/16* (2006.01)
*H03K 17/00* (2006.01)
(52) U.S. Cl.
CPC ......... *H03K 17/162* (2013.01); *H03K 17/007* (2013.01); *H03K 2217/0036* (2013.01)
(58) Field of Classification Search
CPC ............... H03K 17/162; H03K 17/007; H03K 2217/0036
USPC ........................................................ 327/379
See application file for complete search history.

(56) References Cited

U.S. PATENT DOCUMENTS

| 6,752,698 | B1 | 6/2004 | Jensen |
| 7,593,280 | B2 * | 9/2009 | Kim .................... G11C 7/1051 365/222 |
| 10,726,882 | B2 * | 7/2020 | Doo .................... G11C 5/148 |

FOREIGN PATENT DOCUMENTS

CN 109889040 A 6/2019

* cited by examiner

*Primary Examiner* — Tomi Skibinski
(74) *Attorney, Agent, or Firm* — McClure, Qualey & Rodack, LLP

(57) ABSTRACT

A chip includes a level control circuit, an output circuit, a level supply circuit, and an output terminal. The level control circuit is configured to output a response signal in response to an operation mode of the chip. The output circuit has an output side, and the output side couples to the output terminal. When the operation mode of the chip is a working mode, the response signal is at a first level, and the output circuit is configured to output an output signal at the output terminal. When the operation mode of the chip is a power saving mode, the response signal is at a second level, the output side of the output circuit is in a floating state, and the level supply circuit is configured to provide a level voltage to the output terminal according to the response signal, so that the output terminal has a fixed level.

14 Claims, 5 Drawing Sheets

LEAKAGE CONTROL OF MULTI-CHIP MODULE AND METHOD THEREOF

CROSS-REFERENCE TO RELATED APPLICATION

This non-provisional application claims priority under 35 U.S.C. § 119(a) to Patent Application No. 109146553 filed in Taiwan, R.O.C. on Dec. 28, 2020, the entire contents of which are hereby incorporated by reference.

BACKGROUND

Technical Field

The present disclosure relates to the field of multi-chip modules (MCMs), and in particular, to leakage control of a multi-chip module and a method thereof.

Related Art

In order to reduce a size and a volume of chips in an electronic product, a plurality of chips are usually encapsulated in an integrated circuit (IC), which is referred to as a multi-chip module. For example, a microprocessor chip and a memory chip are integrated into a multi-chip module, and the multi-chip module is encapsulated into an IC. If the microprocessor chip and the memory chip are not developed and designed by the same chip design company, problems resulting from integration are likely to be generated. In addition, an I/O pin (I/O PAD) circuit design of the memory chip is directed for non-specific microprocessor chips, and an operation mode of the memory chip is controlled by the microprocessor chip. Therefore, an output pin (PAD) of the microprocessor is in a non-output state as a result of a microprocessor being in a power saving mode, and to this end, if an input pin of the memory chip does not receive output signal from the output pin (PAD) of the microprocessor, the input pin of the memory chip is to be in a floating state. In the above situation, leakage that may be caused by the memory chip may lead to an increase in total power consumption of the chip. Moreover, because the multi-chip module has been encapsulated into one IC, in case of leakage occurring in the multi-chip module, it is impossible or difficult to reduce or avoid the leakage of multi-chip module through an external circuit. In other words, poor access to internal pins of the multi-chip module causes the difficulty in control of the entire IC, which results in an increased leakage.

With the rapid development of current electronic products, demands for low power consumption and a small size of electronic product devices (such as an Internet of Things devices) gradually increase. Therefore, how to control leakage in the multi-chip module well to control leakage of the entire IC is a problem to be resolved.

SUMMARY

In view of the above, the present disclosure provides leakage control of a multi-chip module and a method thereof.

According to some embodiments, the multi-chip module includes a first chip. The first chip includes a level control circuit, a driver circuit, an output circuit, a level supply circuit, and an output terminal. The level control circuit is configured to output a response signal in response to an operation mode of the first chip. When the operation mode is a working mode, the response signal is at a first level. When the operation mode is a power saving mode, the response signal is at a second level. The driver circuit is configured to output a first driving signal. The output circuit has an output side, where the output side is coupled to the output terminal. When the first chip is in the power saving mode, the output side of the output circuit is in a floating state. When the first chip is in the working mode, the output circuit is configured to output an output signal at the output terminal according to the first driving signal. When the first chip is in the power saving mode, the level supply circuit is configured to provide a level voltage to the output terminal according to the response signal, so that the output terminal has a fixed level.

According to some embodiments, the multi-chip module includes a first chip and a second chip. The second chip includes an input circuit and a mode control circuit. The input circuit is coupled to an output terminal of the first chip. The input circuit is configured to receive an output signal from the first chip and output a control signal according to the output signal from the first chip. The mode control circuit is configured to control, according to the control signal outputted by the input circuit, the second chip to be in an idle mode or in an active mode.

According to some embodiments, the method for controlling a leakage of a multi-chip module including a first chip and a second chip is provided. The method includes: generating, in the first chip, a response signal in response to an operation mode of the first chip, wherein when the operation mode is a working mode, the response signal is at a first level, and when the operation mode is a power saving mode, the response signal is at a second level; and generating, in the first chip, a first driving signal; wherein when the first chip is in the working mode, an output circuit of the first chip is configured to output an output signal at an output terminal of the first chip according to the first driving signal; and wherein when the first chip is in the power saving mode, an output side of the output circuit of the first chip is in a floating state, and a level voltage is provided to the output terminal according to the response signal, so that the output terminal of the first chip has a fixed level.

Based on the above, in some embodiments of the present disclosure, when the first chip is in the power saving mode, the output signal of the first chip can be at a first output level instead of being in the floating state. In some embodiments, the multi-chip module includes a first chip and a second chip. When the first chip is in the power saving mode, the output signal of the first chip can be at the first output level instead of being in the floating state. The second chip can operate in the idle mode according to the output signal at the first output level, which can avoid unnecessary power consumption caused by the output signal being in the floating state.

DETAILED DESCRIPTION

In the present disclosure, a "first level" and a "first output level" are used as high levels, and a "second level" and a "second output level" are used as low levels, but the present disclosure is not limited thereto. In other words, correspondingly, the present disclosure can be achieved by using the "first level" and the "first output level" as low levels and the "second level" and the "second output level" as high levels in terms of circuit configuration adjustment.

Figure 1:
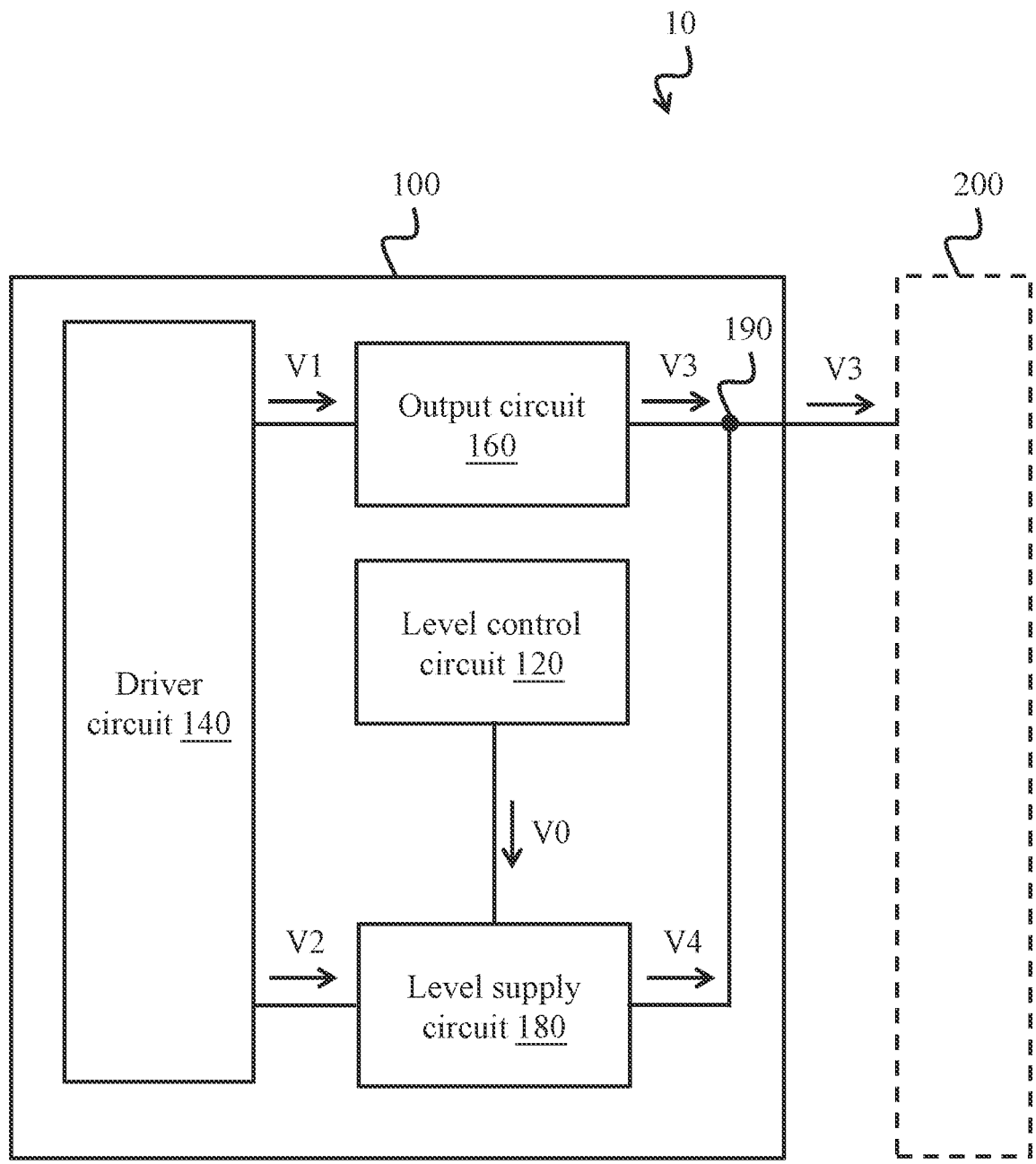
FIG. 1 is a schematic diagram of a multi-chip module according to some embodiments of the present disclosure.

FIG. 1 is a schematic diagram of a multi-chip module 10 according to some embodiments of the present disclosure. Referring to FIG. 1, in some embodiments, the multi-chip module 10 includes a first chip 100. The first chip 100 includes a level control circuit 120, a driver circuit 140, an output circuit 160, a level supply circuit 180, and an output terminal 190. The level control circuit 120 is coupled to the level supply circuit 180. An input side of the output circuit 160 and an input side of the level supply circuit 180 are respectively coupled to the driver circuit 140. An output side of the output circuit 160 and an output side of the level supply circuit 180 are jointly coupled to the output terminal 190. The level control circuit 120 is configured to output a response signal V0 in response to an operation mode of the first chip 100. When an operation mode of the first chip 100 is a working mode (for example, when the driver circuit 140 is in an enabled state), the response signal V0 generated by the level control circuit 120 is at a first level. When the operating mode of the first chip 100 is a power saving mode (for example, when the driver circuit 140 is in a disabled state), the response signal V0 generated by the level control circuit 120 is at a second level. The driver circuit 140 is configured to output a first driving signal V1 and a second driving signal V2. When the first chip 100 is in the working mode, the output circuit 160 is configured to output an output signal V3 at the output terminal 190 of the first chip 100 according to the first driving signal V1. When the first chip 100 is in the power saving mode, the output side of the output circuit 160 is in a floating state. However, in this case, since the level supply circuit 180 is configured to provide a level voltage V4 to the output terminal 190 of the first chip 100 according to the second driving signal V2 and the response signal V0, the output terminal 190 of the first chip 100 has a fixed level instead of being floating. An implementation of the level supply circuit 180 may be a pull-up circuit, a pull-down circuit, or a pull-up and pull-down circuit. It should be particularly noted that an implementation in which the operation mode is the power saving mode is merely an example but not a limitation, and the power saving mode may be replaced with a sleep mode or other non-working operation modes.

In some embodiments, when the first chip 100 is in the working mode, the driver circuit 140 is in an enabled state (the "enabled state" may be short for "enabled" below). When the first chip 100 is in the power saving mode, the driver circuit 140 is in a disabled state (the "disabled state" may be short for "disabled" below). In some embodiments, when the driver circuit 140 is in the enabled state, the output circuit 160 is electrically connected to the output terminal 190 according to the first driving signal V1 (the first driving signal V1 correspondingly outputted by the driver circuit 140 in the enabled state), and the level supply circuit 180 is electrically disconnected from the output terminal 190 according to the second driving signal V2 and the response signal V0 at the first level. In some embodiments, when the driver circuit 140 is in the disabled state, the output circuit 160 is electrically disconnected from the output terminal 190 according to the first driving signal V1 (the first driving signal V1 correspondingly outputted by the driver circuit 140 in the disabled state), and the level supply circuit 180 is electrically connected to the output terminal 190 according to the second driving signal V2 and the response signal V0 at the second level.

Figure 2:
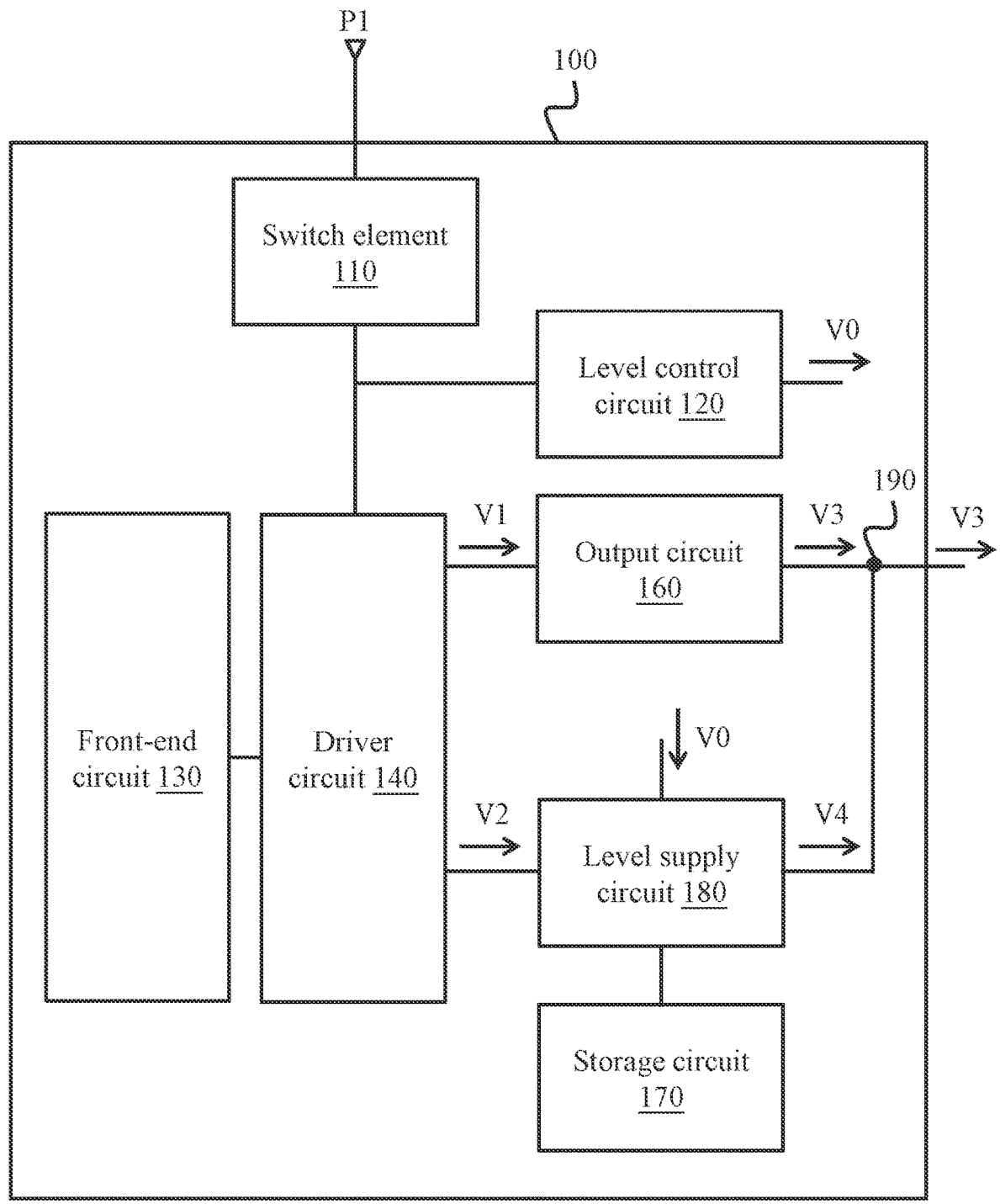
FIG. 2 is a schematic diagram of a first chip according to some embodiments of the present disclosure.

FIG. 2 is a schematic diagram of a first chip 100 according to some embodiments of the present disclosure. Referring to FIG. 2, in some embodiments, the first chip 100 further includes a front-end circuit 130 (for example, a processor, a microprocessor, a controller, or the like). The driver circuit 140 is configured to output a first driving signal V1 and a second driving signal V2 in response to an output of the front-end circuit 130. Specifically, in addition to being affected by the front-end circuit 130, the first driving signal V1 is also affected by the first chip 100 being in a working mode or in a power saving mode. In other words, the first driving signal V1 existing when the first chip 100 is in the working mode is different from the first driving signal V1 existing when the first chip 100 is in the power saving mode. In contrast, the second driving signal V2 is not affected by the first chip 100 being in the working mode or in the power saving mode. In other words, the second driving signal V2 is a signal with a specific fixed potential, and may be outputted by any circuit that can generate the specific fixed potential.

In some embodiments, when the driver circuit 140 is enabled, a voltage (that is, an output signal V3) at the output side of the output circuit 160 may be correspondingly a first output level or a second output level according to a level outputted by the front-end circuit 130. In other words, when the first chip 100 is in the working mode, the output circuit 160 may adjust, according to different first driving signals V1, the output signal V3 outputted. However, when the first chip 100 is in the power saving mode, the driver circuit 140 is disabled, and the output side of the output circuit 160 is only in a floating state (without considering the level supply circuit 180). The response signal V0 corresponds to different operation modes because the level supply circuit 180 provides a level voltage V4 according to the response signal V0. Therefore, when the first chip 100 is in the power saving mode, although the output side of the output circuit 160 is floating, the level supply circuit 180 can provide the level voltage V4 so that the output terminal 190 of the output circuit 160 has a fixed level (for example, the first output level). In other words, when the first chip 100 is in the power saving mode, the output terminal 190 of the first chip 100 can still be at a fixed level instead of being in an uncontrolled floating state. Thus, in some embodiments, the multi-chip module 10 further includes a second chip 200. An input terminal of the second chip 200 is coupled to the output terminal 190 of the first chip 100. In this way, the output terminal 190 at the fixed level can control the input terminal of the second chip 200 to avoid unnecessary leakage.

Still referring to FIG. 2, in some embodiments, the first chip 100 further includes a switch element 110. The switch element 110 has a first terminal and a second terminal. The first terminal of the switch element 110 is coupled to a first input power P1, and the second terminal of the switch element 110 is coupled to the level control circuit 120 and the driver circuit 140. In other words, when the first chip 100 is in the working mode, the switch element 110 is turned on, and the driver circuit 140 is in an enabled state. Oppositely, when the first chip 100 is in the power saving mode, the switch element 110 is turned off, and the driver circuit 140 is in a disabled state.

Figure 3:
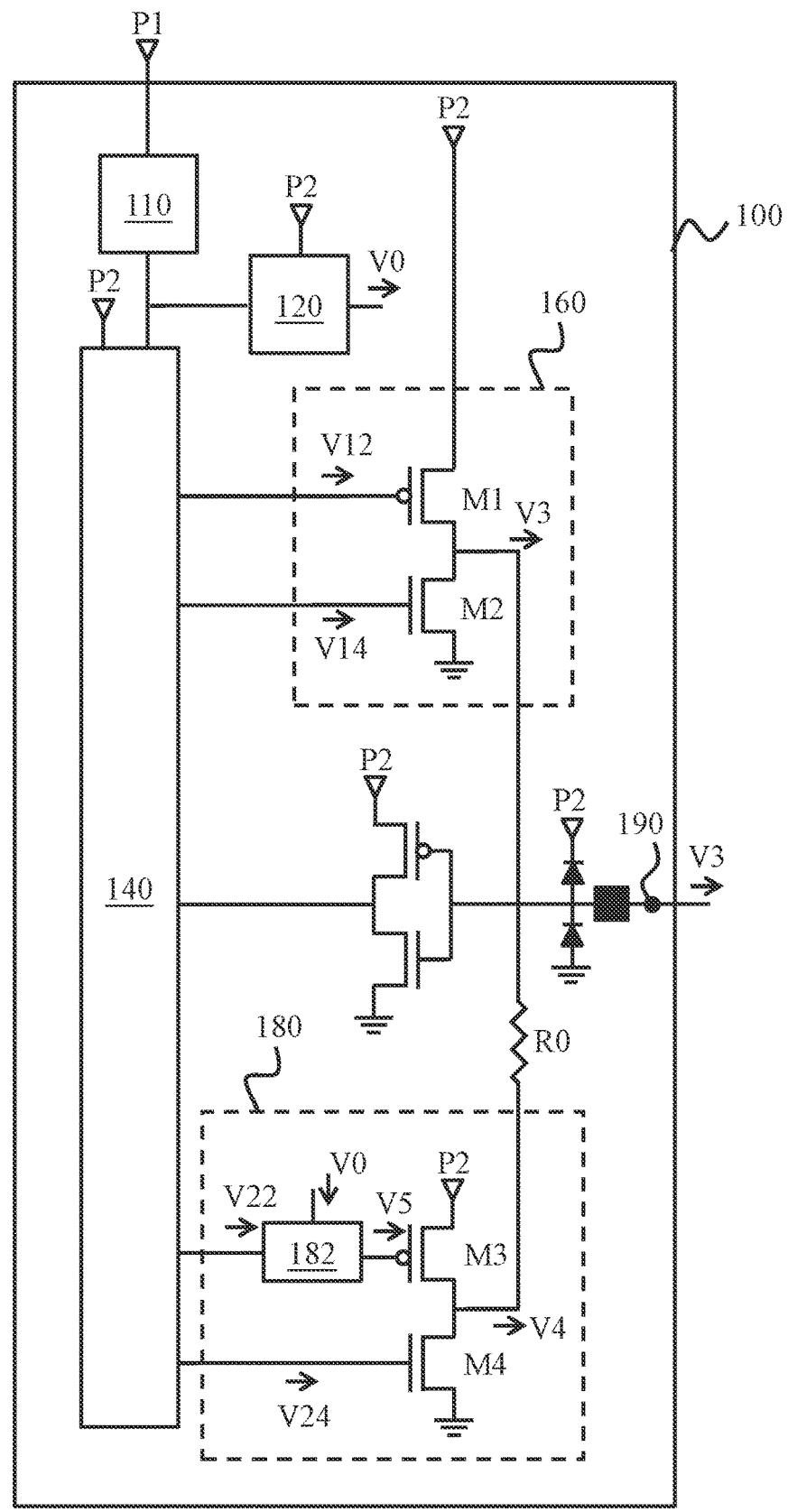
FIG. 3 is a schematic circuit diagram of a first chip according to some embodiments of the present disclosure.

FIG. 3 is a schematic circuit diagram of a first chip 100 according to some other embodiments of the present disclosure. Referring to FIG. 3, in some embodiments, the first chip 100 receives a plurality of input power (for example, a first input power P1 and a second input power P2). The first input power P1 is a core power, and the second input power P2 is an input/output power (I/O power). The driver circuit 140 receives the first input power P1 (for example, 0.9 volts or 1.0 volt), and the level control circuit 120, the front-end circuit 130, the driver circuit 140, the output circuit 160, and the level supply circuit 180 receive the second input power P2 (for example, 3.3 volts or 5.0 volts). However, the present disclosure is not limited thereto. In the embodiment of FIG. 2, the level control circuit 120 generates the response signal V0 according to action of the switch element 110.

In some embodiments, there is a resistor R0 between the output side of the level supply circuit 180 and the output terminal 190 of the first chip 100.

In some embodiments, the first driving signal V1 includes a first output driving signal V12 and a second output driving signal V14. The output circuit 160 includes a first transistor M1 and a second transistor M2. The first transistor M1 is controlled by the first output driving signal V12, and the second transistor M2 is controlled by the second output driving signal V14. When the first chip 100 is in the working mode, if the first transistor M1 is turned on and the second transistor M2 is turned off, the first transistor M1 outputs an output signal V3 at a first output level. Conversely, if the first transistor M1 is turned off and the second transistor M2 is turned on, the second transistor M2 outputs the output signal V3 at a second output level. When the first chip 100 is in the power saving mode, the first transistor M1 and the second transistor M2 are turned off, that is, the output circuit 160 does not output the output signal V3. If the effect of the level supply circuit 180 is not considered herein, connection points of the first transistor M1 and the second transistor M2 are at a floating level (that is, an output side of the output circuit 160 is in a floating state).

Specifically, in some embodiments, when the first transistor M1 is turned on and the second transistor M2 is turned off, the output signal V3 is controlled by the first transistor M1. When the first transistor M1 is turned off and the second transistor M2 is turned on, the output signal V3 is controlled by the second transistor M2. When the first transistor M1 and the second transistor M2 are turned off, neither the first transistor M1 nor the second transistor M2 can control the output signal V3. Therefore, the output signal V3 is at a floating level.

In some embodiments, the first transistor M1 is a P-type transistor, and the second transistor M2 is an N-type transistor.

It should be particularly noted that when the driver circuit 140 is enabled in such a way that the first transistor M1 is turned on and the second transistor M2 is turned off, the first transistor M1 may pull up the output signal V3 to the second input power P2 according to the second input power P2, that is, pull up the output signal to a first level. In contrast, when the driver circuit 140 is enabled in such a way that the first transistor M1 is turned off and the second transistor M2 is turned on, the second transistor M2 may pull down the output signal V3 to a ground level according to the ground level of the ground terminal, that is, pull down the output signal to a second level.

In some embodiments, the second driving signal V2 includes a first level driving signal V22 and a second level driving signal V24. The level supply circuit 180 includes a logic element 182, a third transistor M3, and a fourth transistor M4. The logic element 182 is coupled between the driver circuit 140 and the third transistor M3. The logic element 182 is configured to generate a logic signal V5 according to the first level driving signal V22 and the response signal V0. The third transistor M3 is controlled by the logic signal V5, and the fourth transistor M4 is controlled by the second level driving signal V24. When the first chip 100 is in a working mode, the third transistor M3 and the fourth transistor M4 are turned off, and the level supply circuit 180 does not provide a level voltage V4. When the first chip 100 is in a power saving mode, the fourth transistor M4 is turned off, and the third transistor M3 is turned on through action of the logic element 182 to provide the level voltage V4.

Specifically, in some embodiments, when the first chip 100 is in the working mode and both the third transistor M3 and the fourth transistor M4 are turned off, the level supply circuit 180 does not provide the level voltage V4. Therefore, the output signal V3 outputted by the output circuit 160 is not affected by the level supply circuit 180. In contrast, when the first chip 100 is in the power saving mode, the third transistor M3 is turned on, the fourth transistor M4 is turned off, and the output circuit 160 has no output, and the level supply circuit 180 provides the level voltage V4. Therefore, the output terminal 190 of the first chip 100 has a fixed level corresponding to the level voltage V4.

In some embodiments, the logic element 182 is an AND gate. When the first chip 100 is in the working mode (when the driver circuit 140 is enabled and the switch element 110 is turned on), the first level driving signal V22 is at the first level, the response signal V0 is at the second level, and the logic signal V5 is at the second level. When the first chip 100 is in the power saving mode (when the driver circuit 140 is disabled and the switch element 110 is turned off), the first level driving signal V22 is at the first level, the response signal V0 is at the first level, and the logic signal V5 is at the first level. Therefore, when the first chip 100 is in the working mode, the third transistor M3 and the fourth transistor M4 are turned off. When the first chip 100 is in the power saving mode, the third transistor M3 is turned on, and the fourth transistor M4 is turned off.

In some embodiments, the third transistor M3 is a P-type transistor, and the fourth transistor M4 is an N-type transistor.

Specifically, in some embodiments, the logic element 182 is an AND gate. When the first chip 100 is in the working mode, the response signal V0 is at the second level, and the driver circuit 140 outputs the first level driving signal V22 at the first level and the second level driving signal V24 at the second level. Therefore, the logic signal V5 is at the second level. Therefore, the third transistor M3 is turned on, and the fourth transistor M4 is turned off. The third transistor M3 may pull up the level voltage V4 approximately to the second input power P2 according to the second input power P2, that is, pull up the level voltage to the first output level. Therefore, the third transistor M3 may also pull up the output terminal 190 of the first chip 100 approximately to the first output level.

In some embodiments, if the first chip 100 is in the power saving mode (when the driver circuit 140 is disabled and the switch element 110 is turned off), the response signal V0 is at the first level. The logic element 182 may be designed to be coupled between the driver circuit 140 and the fourth transistor M4, and the logic element 182 may be designed as an OR gate. Therefore, the third transistor M3 is turned off, and the fourth transistor M4 is turned on. In this case, the fourth transistor M4 may pull down the level voltage V4 to a ground potential according to the ground potential of the ground terminal, that is, pull down the level voltage to the second output level. Therefore, the fourth transistor M4 may also pull down the output terminal 190 of the first chip 100 to the second output level.

Referring to FIG. 2 and FIG. 3 together, in some embodiments, the first chip 100 further includes a storage circuit 170. The storage circuit 170 is configured to store a stored value and adjust the level voltage V4 provided by the level supply circuit 180 to a high level or a low level. In other words, the level supply circuit 180 determines, according to the stored value in the storage circuit 170, whether the level voltage V4 provided to the output terminal 190 of the first chip 100 is at a high level or a low level. In addition, in some embodiments, the second chip 200 includes an input circuit 210. Due to circuit characteristics of the input circuit 210 of the second chip 200, the level voltage V4 provided by the level supply circuit 180 may be at a high level (the second input power P2) or a low level (the ground potential of the ground terminal). Considering that the input circuit 210 of the second chip 200 has a pull-up resistor or a pull-down resistor, the level supply circuit 180 may also set the third transistor M3 and the fourth transistor M4 to be turned off according to the stored value in the storage circuit 170, so that connection points of the third transistor M3 and the fourth transistor M4 (the output side of the level supply circuit 180) are in a floating state, and leakage of the entire multi-chip module 10 is directly avoided by using the pull-up resistor or the pull-down resistor of the input circuit 210 of the second chip 200.

Figure 4:
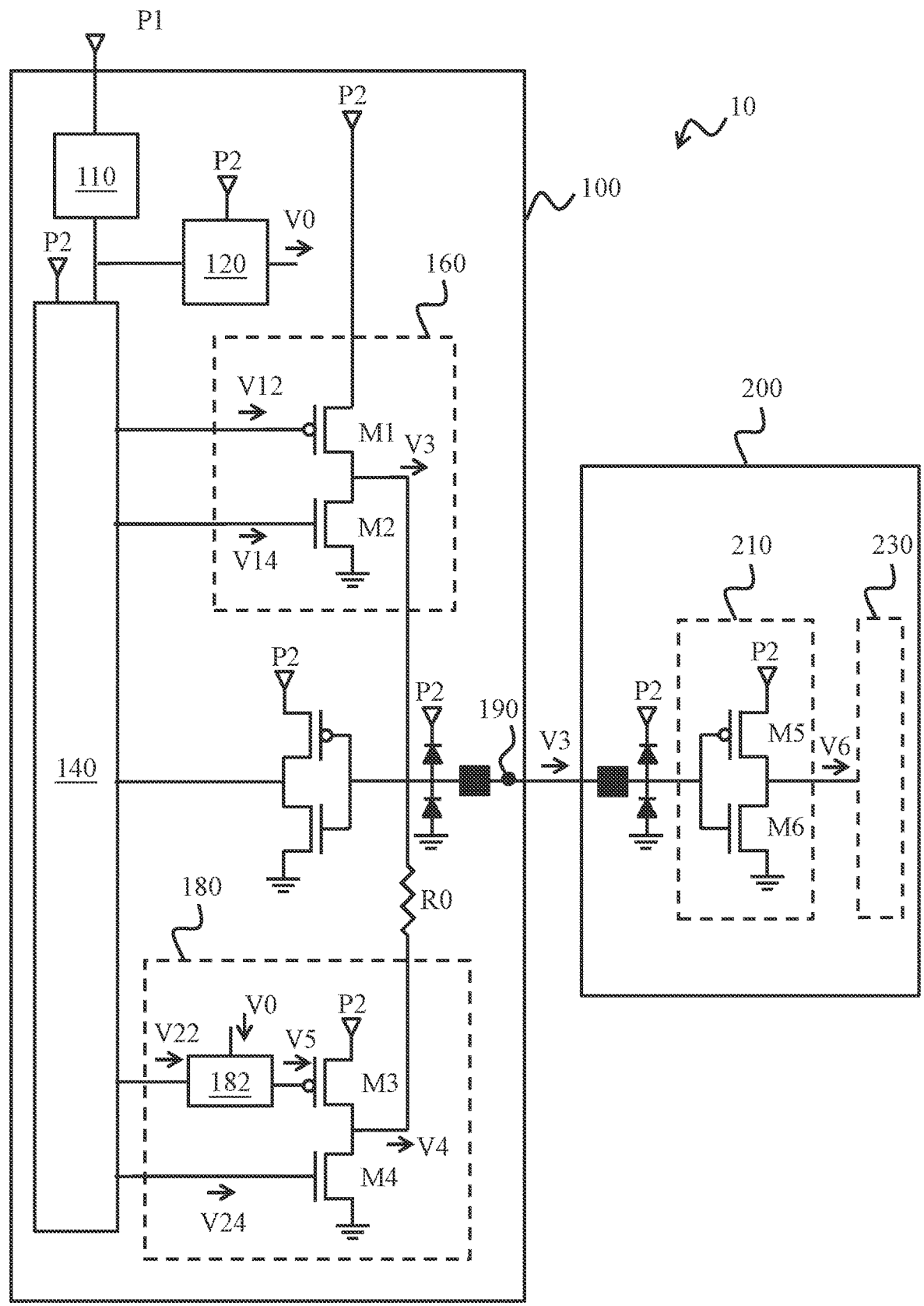
FIG. 4 is a schematic circuit diagram of a multi-chip module according to some embodiments of the present disclosure.

FIG. 4 is a schematic circuit diagram of a multi-chip module 10 according to some embodiments of the present disclosure. Referring to FIG. 4, in some embodiments, the multi-chip module 10 includes a first chip 100 and a second chip 200. The first chip 100 is coupled to the second chip 200 and controls and accesses the second chip 200. Specifically, an output pad of the first chip 100 is coupled to an input pad of the second chip 200. In an embodiment, the second chip 200 is a memory chip, and the input pad of the second chip 200 is a chip select pin or a chip enable pin of the memory chip.

In some embodiments, the second chip 200 includes an input circuit 210 and a mode control circuit 230. The input circuit 210 is coupled to an output terminal 190 of the first chip 100, and the input circuit 210 is coupled to the mode control circuit 230. The input circuit 210 of the second chip 200 is configured to receive an output signal V3 from the output terminal 190 of the first chip 100, and output a control signal V6 according to the output signal V3. The mode control circuit 230 receives the control signal V6 outputted by the input circuit 210, and controls the second chip 200 to be in an idle mode or in an active mode according to the control signal V6.

It should be particularly noted that, in some embodiments, when the multi-chip module 10 is operating in a power saving mode, the first chip 100 is also operating in the power saving mode, and the second chip 200 is in the idle mode. When the multi-chip module 10 is operating in the working mode, and the first chip 100 is operating in the working mode, the second chip 200 may be in the active mode or in the idle mode under the control of the output signal V3. In other words, when the multi-chip module 10 is operating in the power saving mode (that is, the first chip 100 is operating in the power saving mode), the level voltage V4 can be used to adjust the output terminal 190 of the first chip 100 from a floating state to a first output level. Therefore, when the first chip 100 is operating in the power saving mode, it can be ensured that the second chip 200 is in the idle mode. If the output terminal 190 of the first chip 100 is in the floating state, the second chip 200 may be caused to enter the active mode, causing unnecessary power consumption.

In some embodiments, the input circuit 210 includes a fifth transistor M5 and a sixth transistor M6. The fifth transistor M5 is a P-type transistor, and the sixth transistor M6 is an N-type transistor.

In some embodiments, the first chip 100 further includes two diodes. The two diodes are ESD protection circuits disposed at the output terminal 190 of the first chip 100. In some embodiments, the second chip 200 further includes two diodes. The two diodes are ESD protection circuits disposed at an input terminal of the second chip 200.

Figure 5:
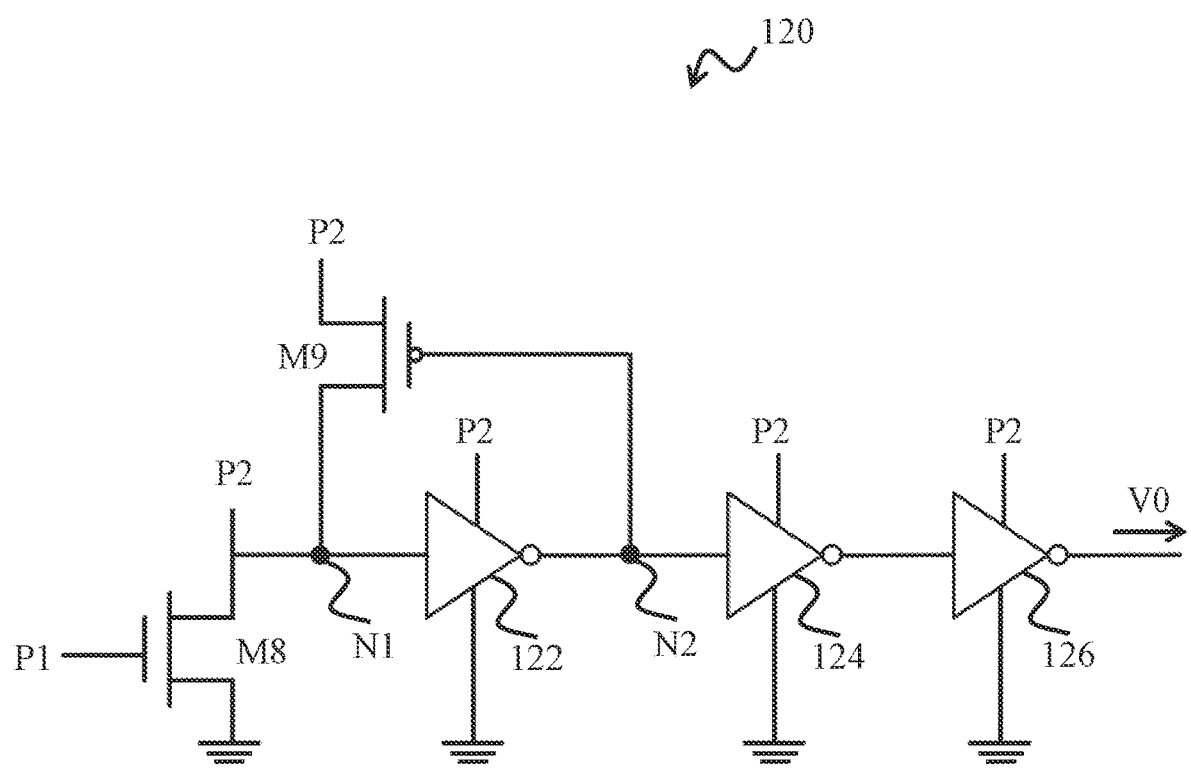
FIG. 5 is a schematic diagram of a level control circuit according to some embodiments of the present disclosure.

FIG. 5 is a schematic diagram of a level control circuit 120 according to some embodiments of the present disclosure. Referring to FIG. 5, in some embodiments, the level control circuit 120 includes an eighth transistor M8, a ninth transistor M9, a first inverter 122, a second inverter 124, a third inverter 126, a first node N1, and a second node N2. The ninth transistor M9 is a P-type transistor, and the eighth transistor M8 is an N-type transistor. The first inverter 122, the second inverter 124, and the third inverter 126 have a threshold voltage. The eighth transistor M8 includes an eighth gate terminal, an eighth source terminal, and an eighth drain terminal. The ninth transistor M9 includes a ninth gate terminal, a ninth source terminal, and a ninth drain terminal. The first inverter 122 includes a first input terminal and a first output terminal. The second inverter 124 includes a second input terminal and a second output terminal. The third inverter 126 includes a third input terminal and a third output terminal. The eighth drain terminal and the ninth source terminal receive a second input power P2. The eighth gate terminal receives a first input power P1. The eighth drain terminal, the ninth drain terminal, and the first input terminal are coupled to the first node N1. The eighth source terminal is coupled to a ground terminal. The ninth gate terminal, the first output terminal, and the second input terminal are coupled to the second node N2. The second output terminal is coupled to the third input terminal. The third output terminal is configured to output the response signal V0. In other words, the level control circuit 120 outputs a corresponding response signal V0 from the third output terminal according to a signal indicating whether the driver circuit 140 is enabled or disabled and received by the eighth gate terminal.

Specifically, in some embodiments, when the driver circuit 140 is disabled, for example, the signal received by the eighth gate terminal and indicating that the driver circuit 140 is disabled is at a second level. A first node voltage of the first node N1 is greater than a threshold voltage of the first inverter 122. Therefore, a second node voltage of the second node N2 is to be at the second level, and the first node voltage of the first node N1 is pulled up to the second input power P2 through feedback of the ninth transistor M9. In other words, the ninth gate terminal is turned on according to the second node voltage at the second level. Therefore, the first node voltage of the first node N1 is pulled up to the second input power P2 by the ninth transistor M9 that is turned on.

In some embodiments, the first chip 100 and the multi-chip module 10 are applied, for example, but not limited to, in IoT devices, mobile devices, or other electronic devices.

In some embodiments, a method for controlling a leakage of a multi-chip module 10 including a first chip 100 and a second chip 200 is provided. The method includes: generating, in the first chip 100, a response signal V0 in response to an operation mode of the first chip 100, wherein when the operation mode is a working mode, the response signal V0 is at a first level, and when the operation mode is a power saving mode, the response signal V0 is at a second level; and generating, in the first chip 100, a first driving signal V1; wherein when the first chip 100 is in the working mode, an output circuit 160 of the first chip 100 is configured to output an output signal V3 at an output terminal 190 of the first chip 100 according to the first driving signal V1; and wherein when the first chip 100 is in the power saving mode, an output side of the output circuit 160 of the first chip 100 is in a floating state, and a level voltage V4 is provided to the output terminal 190 according to the response signal V0, so that the output terminal 190 of the first chip 100 has a fixed level.

Although the present disclosure has been described in considerable detail with reference to certain preferred embodiments thereof, the disclosure is not for limiting the scope of the disclosure. Persons having ordinary skill in the art may make various modifications and changes without departing from the scope and spirit of the disclosure. Therefore, the scope of the appended claims should not be limited to the description of the preferred embodiments described above.

What is claimed is:

1. A multi-chip module, comprising a chip, the chip comprising:
    a level control circuit configured to output a response signal in response to an operation mode of the chip, wherein when the operation mode is a working mode, the response signal is at a first level, and when the operation mode is a power saving mode, the response signal is at a second level;
    a driver circuit configured to output a first driving signal;
    an output terminal;
    an output circuit having an output side, wherein the output side is coupled to the output terminal, when the chip is in the power saving mode, the output side of the output circuit is in a floating state, and when the chip is in the working mode, the output circuit is configured to output an output signal at the output terminal according to the first driving signal; and
    a level supply circuit, wherein when the chip is in the power saving mode, the level supply circuit is configured to provide a level voltage to the output terminal according to the response signal, so that the output terminal has a fixed level.

2. The multi-chip module according to claim 1, wherein the chip further comprises:
    a switch element having:
        a first terminal coupled to an input power; and
        a second terminal coupled to the level control circuit and the driver circuit;
    wherein, when the chip is in the working mode, the switch element is turned on, and the driver circuit is in an enabled state; and
    wherein, when the chip is in the power saving mode, the switch element is turned off, and the driver circuit is in a disabled state.

3. The multi-chip module according to claim 1, wherein the chip further comprises a front-end circuit, and the driver circuit is configured to output the first driving signal in response to an output of the front-end circuit.

4. The multi-chip module according to claim 1, wherein when the chip is in the working mode, the driver circuit is in an enabled state, the output circuit is electrically connected to the output terminal according to the first driving signal corresponding to the enabled state, and the level supply circuit is electrically disconnected from the output terminal the response signal at the first level.

5. The multi-chip module according to claim 1, wherein when the chip is in the power saving mode, the driver circuit is in a disabled state, the output circuit is electrically disconnected from the output terminal according to the first driving signal corresponding to the disabled state, and the level supply circuit is electrically connected to the output terminal according to the response signal at the second level.

6. The multi-chip module according to claim 1, wherein the first driving signal comprises a first output driving signal and a second output driving signal, and the output circuit comprises:
    a first transistor controlled by the first output driving signal; and
    a second transistor controlled by the second output driving signal;
    wherein, when the chip is in the working mode, the first transistor is turned on, and the second transistor is turned off, the first transistor outputs the output signal at a first output level;
    wherein, when the chip is in the working mode, the first transistor is turned off, and the second transistor is turned on, the second transistor outputs the output signal at a second output level; and
    wherein, when the chip is in the power saving mode, and the first transistor and the second transistor are turned off, the output circuit does not output the output signal.

7. The multi-chip module according to claim 1, wherein the level supply circuit comprises:
    a logic element configured to generate a logic signal according to the response signal;
    a third transistor; and
    a fourth transistor;
    wherein, when the chip is in the working mode, and the third transistor and the fourth transistor are turned off, the level supply circuit does not output the level voltage; and
    wherein, when the chip is in the power saving mode, the third transistor is turned on, the fourth transistor is turned off, and the level supply circuit is configured to output the level voltage.

8. The multi-chip module according to claim 7, wherein the logic element is an AND gate.

9. The multi-chip module according to claim 1, wherein the chip further comprises:
    a storage circuit configured to store a stored value;
    wherein, the level supply circuit determines, according to the stored value, whether the level voltage outputted is at a high level or a low level.

10. The multi-chip module according to claim 1, further comprising another chip, wherein the chip is configured to access the another chip, and the another chip comprises:
    an input circuit coupled to the output terminal of the chip and configured to receive the output signal from the chip and output a control signal according to the output signal from the chip; and
    a mode control circuit configured to control the another chip to be in an idle mode or an active mode according to the control signal outputted by the input circuit.

11. A method for controlling a leakage of a multi-chip module comprising a first chip and a second chip, the method comprising:
    generating, in the first chip, a response signal in response to an operation mode of the first chip, wherein when the operation mode is a working mode, the response signal is at a first level, and when the operation mode is a power saving mode, the response signal is at a second level; and
    generating, in the first chip, a first driving signal;
    wherein when the first chip is in the working mode, an output circuit of the first chip is configured to output an output signal at an output terminal of the first chip according to the first driving signal; and
    wherein when the first chip is in the power saving mode, an output side of the output circuit of the first chip is in a floating state, and a level voltage is provided to the output terminal according to the response signal, so that the output terminal of the first chip has a fixed level.

12. The method according to claim 11, wherein the first chip comprises a front-end circuit, and the first driving signal is generated in response to an output of the front-end circuit.

13. The method according to claim 11, wherein the level voltage is at a high level or a low level according to a stored value.

14. The method according to claim 11, wherein the second chip comprises:
    an input circuit coupled to the output terminal of the first chip and configured to receive the output signal from the first chip and output a control signal; and
    a mode control circuit configured to control the second chip to be in an idle mode or an active mode according to the control signal outputted by the input circuit.

\* \* \* \* \*